July 23, 1957 J. I. PANKOVE 2,800,617

SEMICONDUCTOR DEVICES

Filed June 1, 1954

INVENTOR.
Jacques I. Pankove
BY J. L. Whittaker
ATTORNEY

United States Patent Office 2,800,617

Patented July 23, 1957

2,800,617

SEMICONDUCTOR DEVICES

Jacques I. Pankove, Princeton, N. J., assignor to Radio Corporation of America, a corporation of Delaware Application June 1, 1954, Serial No. 433,620

8 Claims. (Cl. 317—235)

Figure 1:
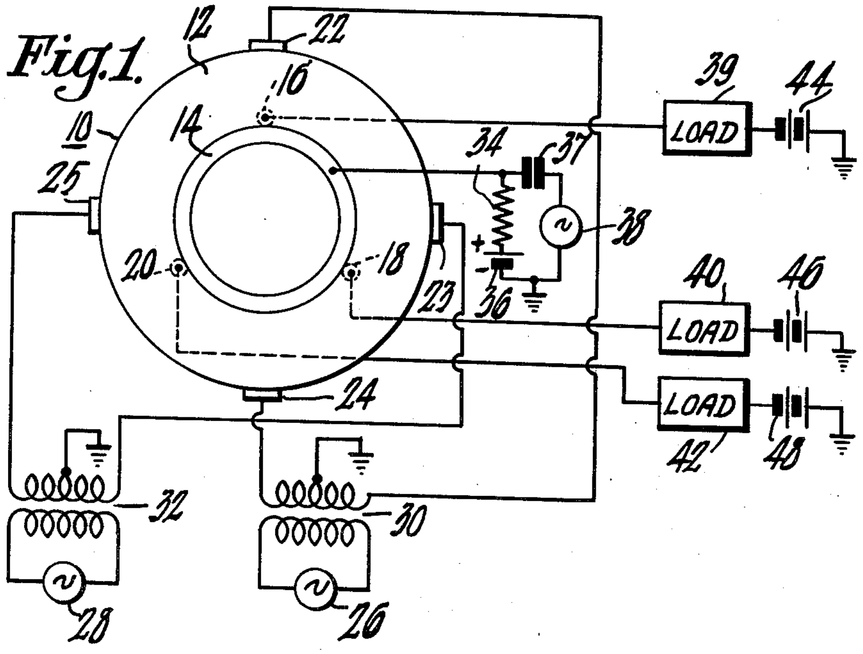

This invention relates to semiconductor devices and particularly to multi-electrode semiconductor devices and systems in which they may be employed.

One type of semiconductor device known as a transistor and comprises a body of semiconductor material of one type of conductivity having at least two rectifying electrodes in operative relation therewith. The rectifying electrodes may comprise point contact electrodes or junction electrodes. Such junction electrodes may comprise, for example, zones of N-type and P-type conductivity semiconductor material separated by rectifying barriers which have high resistance to electrical current flow in one direction and low resistance to such flow in the reverse direction.

In such devices, one of the rectifying electrodes is operated as an emitter electrode and injects minority charge carriers into the semiconductor body, said carriers being collected by the other rectifying electrode which is operated as a collector electrode. A base electrode is generally connected in ohmic (non-rectifying) contact with the semiconductor body and serves to control the emitter-to-collector current flow.

In a co-pending U. S. patent application of G. C. Sziklai and G. B. Herzog, Serial No. 363,332, filed June 22, 1953, there is disclosed a semiconductor device for performing switching or modulating functions. The device disclosed in said co-pending application includes a semiconductor crystal having a large-area generally disk-shaped emitter electrode which injects minority charge carriers which are directed to each of a plurality of collector electrodes by means of a rotating electric field. In such construction, much of the current injected by the emitter does not reach a collector and is lost. In addition, the carriers are injected by different portions of the emitter and they traverse transit paths of differing lengths and different transit times whereby the frequency response of the device is adversely affected.

Accordingly, an object of this invention is to provide an improved semiconductor device suitable for high frequency operation.

Another object of this invention is to provide an improved semiconductor switching device and system for operation at high frequencies.

A further object of this invention is to provide a semiconductor device having improved current flow between the input and output electrodes whereby improved high frequency operation is achieved.

The present invention is an improvement over the invention disclosed and claimed in the aforementioned application and comprises an improved semiconductor switching or modulating device and system having an electrode construction and arrangement providing more efficient operation and better high frequency performance.

In general, the purposes and objects of this invention are accomplished by a semiconductor device including a semiconductor body having two closely spaced plane, parallel surfaces. An input emitter rectifying electrode is positioned on one surface of the semiconductor body.

The emitter electrode has an area defined by two closely-spaced similar, concentric boundaries which may be, for example, circles, triangles or the like. If the boundaries are circular, the emitter comprises a ring. A plurality of small area output or collector rectifying electrodes are positioned either on the same surface of the semiconductor body and surrounding the emitter electrodes or, to facilitate the construction, on the opposite surface and surrounding the projection of the emitter electrode on said opposite surface. The collector rectifying electrodes are positioned, for optimum operation, substantially tangent to the periphery of the emitter electrode. A rotating electric field is provided in the body to control the flow of minority charge carriers from the emitter to the various collectors. The rotating electric field is produced by quadrature voltages applied to ohmic electrodes spaced on the periphery of the semiconductor body. The field may be adjusted, so that as it rotates, it biases to cut-off all but the small portion of the emitter which instantaneously injects minority charge carriers. Thus, the device provides more efficient utilization of the emitter electrode and an improved spatial relationship between the emitter and collector electrodes to achieve more uniform carrier transit times and better high frequency operation.

Figure 2:
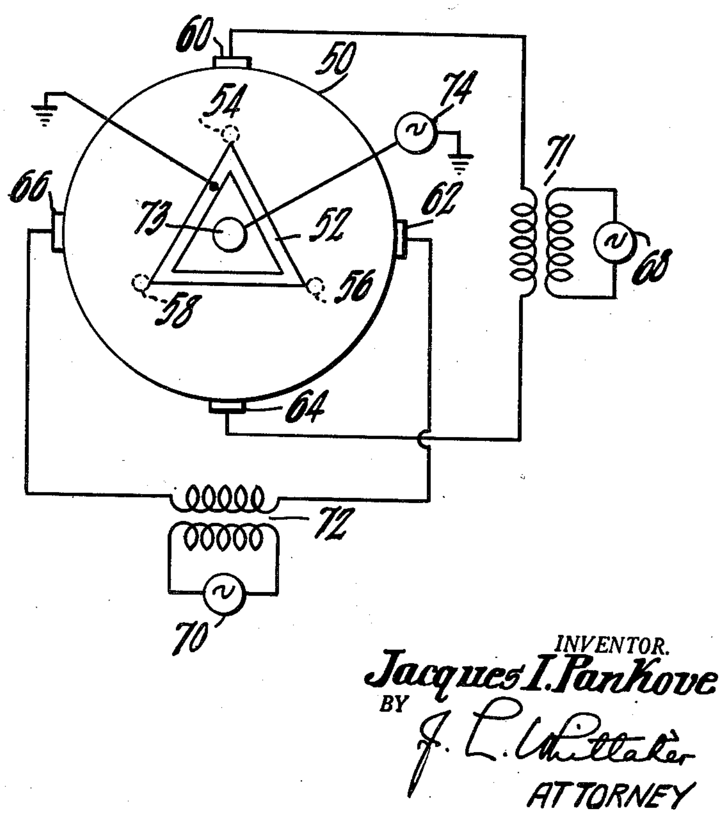

The invention is described in greater detail by reference to the drawing wherein:

Fig. 1 is a plan view of one embodiment of the invention and a schematic representation of a circuit in which it may be operated; and, Fig. 2 is a plan view of a modification of the device shown in Fig. 1, including a schematic representation of a portion of the circuit in which it may be operated.

Similar elements are designated by similar reference characters throughout the drawing.

Referring to Figure 1, a device 10 embodying the principles of the invention comprises a body or crystal 12 of semiconductor material, for example germanium or silicon or the like of N-type or P-type conductivity. The semiconductor body or crystal will henceforth be described as N-type germanium and may be in the form of a thin circular disk or rectangular plate and in this embodiment is preferably in the form of a disk having two large-area plane, parallel surfaces. The device 10 is provided with a ring-shaped emitter rectifying electrode 14 in contact with one surface of the crystal 12 and defined by two concentric circles spaced as close together as possible, for example, a distance of 5 mils or less. In addition, a plurality of comparatively small-area rectifying collector electrodes 16, 18, 20 are provided in contact with the opposite surface of the crystal.

The collector electrodes 16, 18, 20 are in the form of disks or plates or the like and are spaced substantially radially equidistant from the center of the emitter ring 14. These electrodes are also spaced approximately 120° apart circumferentially. The collector electrodes are preferably positioned so that they are substantially tangent to the periphery of the projection of the emitter ring on the opposite surface on which the collectors are positioned.

The rectifying emitter and collector electrodes may be films or plates in rectifying contact with the surfaces of the crystal 12 or they may be P-N junction electrodes. For the purposes of the present description, the rectifying electrodes will be assumed to be P-N junction electrodes.

The P-N junction electrodes are formed preferably by an alloying or fusion process described and claimed in a co-pending U. S. patent application of C. W. Mueller, Serial Number 295,304, filed June 24, 1952, and assigned to the assignee of this application. According to the method described in said application a ring and disks or pellets of a so-called impurity material, are placed in contact with the surfaces of the crystal 12 of N-type germanium. The assembly of crystal and impurity materials is heated in an atmosphere of hydrogen, or an inert gas such as argon. The heating is effected at a temperature sufficient to cause the quantities of impurity material to melt and alloy with the germanium block to form the P–N junctions.

With a body of N-type germanium, the impurity material may comprise one or more acceptor substances such as indium, aluminum, gallium, boron or zinc. If the semiconductor body is of P-type germanium, the impurity material may comprise one or more donor substances such as arsenic, bismuth, antimony, sulfur, selenium, tellurium or phosphorus.

Four non-rectifying base electrodes 22, 23, 24, 25 are soldered or otherwise secured to the crystal 12, preferably at its periphery, and in ohmic contact therewith. The base electrodes are positioned 90° apart on the crystal.

In operation of the device 10, a rotating electric field is established in the crystal 12. Such a field is obtained by applying two sinusoidal signals, 90° out of phase with each other, from signal sources 26 and 28 connected through transformers 30 and 32 between the diametrically opposed base electrodes 22, 24 and 23, 25 respectively. The secondary windings of the transformers are grounded at their center as shown.

The emitter ring 14 is connected through a bias resistor 34 to the positive terminal of a bias battery 36, the negative terminal of which is connected to a source of reference potential such as ground. The emitter is thus biased in the forward direction with respect to the germanium crystal. The emitter is also connected through a coupling capacitor 37 to a signal source 38. The collector electrodes 16, 18, 20 are connected to load circuits 39, 40, 42, respectively, and to the negative terminals of bias batteries 44, 46, 48, respectively, the positive terminals of which are grounded. The collectors are thus biased in the reverse direction with respect to the germanium crystal 12.

In operation of the device 10, a current of minority charge carriers is injected into the germanium body 12 by the emitter electrode 14 under the control of the signal from the source 38. Under the control of the rotating electric field established by the signal sources 26 and 28, the current from the emitter is transmitted to each of the collector electrodes 16, 18, 20 in turn. The flow of minority charge carriers to each collector provides an output current appearing in the load circuit of each collector. The device 10 may thus be employed as a signal demodulator whereby a single composite input signal may be converted into a plurality of separate output signals.

In operation of the device, the emitter ring 14 is initially biased in the forward direction with respect to the crystal 12. However, as the electric field rotates around the germanium crystal, in each position at which it accelerates holes from the emitter toward a particular collector, it sets up a potential distribution in the crystal such that a region of the crystal beneath that portion of the emitter ring which is remote from the particular collector, acquires a more positive bias than the emitter so that, in effect, a portion of the emitter ring is cut off and does not inject holes. Thus, if the electric field is sufficiently strong, all of the emitter may be cut off except a small portion immediately adjacent to the operative collector. As a result, the charge transit paths between the emitting portion of the emitter and the collector are substantially uniform and good high frequency operation is achieved. The positioning of the collector electrodes substantially tangent to the emitter electrode further promotes high frequency operation by providing an optimum balance between close spacing of emitter and collector and uniformity of the transit paths between these electrodes.

An emitter of the type described is preferred to a large-area solid disk emitter since, with a weak rotating electric field, substantially all of the surface of a disk emitter would inject charge carriers many of which would be lost and others of which would follow non-uniform transit paths to each collector. In addition, even with a strong electric field which would cut off some of the disk area, there would still be portions of the emitter which would provide undesired charge injection. Another construction for a semiconductor device embodying the principles of the invention is shown in Figure 2 and includes a semiconductor crystal 50 having an emitter rectifying electrode 52 defined by the area between two concentric closely spaced equilateral triangles on one surface of the crystal. Collector rectifying electrodes 54, 56, 58 are placed on the opposite surface of the crystal and are positioned substantially at each corner of the emitter triangle. Four ohmic base electrodes 60, 62, 64, 66 are provided on the crystal and signal sources 68 and 70, which provide alternating signals 90° out of phase with each other, are connected through transformers 71 and 72 respectively between electrodes 60, 64 and 62, 66 respectively to provide a rotating electric field in the crystal 50.

In order to avoid center tapped secondaries on the transformers 71 and 72, another ohmic base electrode 73 is bonded to the crystal 50 preferably within the triangle emitter 52 to provide a reference potential. In this construction, base signal input is employed and the base electrode 73 is connected to a signal source 74 and to ground and the emitter 52 is connected directly to ground. Appropriate circuitry (not shown) of the type described above with respect to Figure 1 is connected to the collector electrodes 54, 56, 58.

When a rotating electric field of optimum magnitude is employed, the device shown in Figure 2 provides a favorable limited region of injection of the emitter electrode as the electric field rotates in the crystal 50. Optimum utilization of the emitter electrode and improved high frequency operation are thus achieved.

The principles of the invention are not limited to a device having only three collector electrodes positioned around the central ring or triangular electrode. In addition, other methods may be employed for obtaining a rotating electric field, for example by means of three equispaced base electrodes with appropriate three-phase signals applied thereto.

In all of the embodiments of the invention P-type and N-type material may be interchanged if the appropriate bias voltages are applied as is well known in the art. Furthermore, the rectifying electrodes may be point or line contacts, surface contact films or plates or they may be P–N junction electrodes. Alternatively, magnetic fields may be employed for deflecting the flow of minority charge carriers.

What is claimed is:

1. A semiconductor device comprising a body of semiconductor material, a first electrode in rectifying contact with said body, said first electrode being defined by the area between two concentric similar boundaries, a plurality of other electrodes in rectifying contact with said body and positioned about said first electrode, and means for establishing a rotating field in said body for controlling the current flow between said first electrode and said plurality of other electrodes.

2. The device defined in claim 1 wherein said boundaries are circles.

3. The device defined in claim 1 wherein said boundaries are triangles.

4. A semiconductor device comprising a body of semiconductor material, a first electrode in rectifying contact with said body, said first electrode being defined by the area between two concentric equilateral triangles, three other electrodes in rectifying contact with said body with one of said other electrodes positioned adjacent to each corner of said first electrode, and electrode means in contact with said body for establishing a rotating electric field in said body for controlling the current flow between said first electrode and said three other electrodes.

5. A semiconductor device comprising a body of semiconductor material, a first electrode in rectifying contact with said body, said first electrode being defined by the area between two concentric similar boundaries, a plurality of other electrodes in rectifying contact with said body and positioned about said first electrode and substantially effectively tangent to the periphery of said first electrode, and electrode means in contact with said body for establishing a rotating electric field in said body for controlling the current flow between said first electrode and said plurality of other electrodes.

6. A semiconductor device comprising a body of semiconductor material having a pair of substantially plane parallel surfaces, a first electrode in rectifying contact with one of said surfaces of said body, said first electrode being defined by the area between two concentric similar boundaries, a plurality of other electrodes in rectifying contact with the other of said surfaces of said body and positioned about the projection of said first electrode on said other surface, and electrode means in contact with said body for establishing a rotating electric field in said body for controlling the current flow between said first electrode and said plurality of other electrodes.

7. The device defined in claim 6 wherein said other electrodes are substantially tangent to the periphery of the projection of said first electrode on said other surface.

8. A semiconductor device comprising a body of semiconductor material having a pair of substantially plane parallel surfaces, a first rectifying electrode in contact with one of said surfaces, said first electrode being defined by the area between two concentric similar boundaries, a plurality of other electrodes in rectifying contact with said body and positioned about said first electrode, ohmic contact electrodes in contact with said body for establishing a rotating electric field in said body for controlling the current flow between said first electrode and said plurality of other electrodes.

References Cited in the file of this patent

UNITED STATES PATENTS

| | | |
|---|---|---|
| 1,975,517 | Nicolson | Oct. 2, 1934 |
| 2,586,080 | Pfann | Feb. 19, 1952 |
| 2,672,528 | Shockley | Mar. 16, 1954 |